United States Patent
Uemura et al.

(10) Patent No.: US 7,332,747 B2
(45) Date of Patent: Feb. 19, 2008

(54) LIGHT-EMITTING DIODE FOR DECORATION

(75) Inventors: Seiya Uemura, Kawasaki (JP); Atsushi Shinohara, Saitama (JP)

(73) Assignee: Toki Corporation, Tokyo (JP)

( * ) Notice: Subject to any disclaimer, the term of this patent is extended or adjusted under 35 U.S.C. 154(b) by 0 days.

(21) Appl. No.: 11/361,011

(22) Filed: Feb. 24, 2006

(65) Prior Publication Data

US 2006/0202218 A1   Sep. 14, 2006

(30) Foreign Application Priority Data

Feb. 25, 2005   (JP)   .............................. 2005-050564

(51) Int. Cl.
*H01L 33/00* (2006.01)

(52) U.S. Cl. .......................... 257/98; 257/79

(58) Field of Classification Search ................ 257/79, 257/99, 13, 80, 98; 313/498, 512, 496; 345/82; 362/555; 438/800
See application file for complete search history.

(56) References Cited

U.S. PATENT DOCUMENTS

| | | | |
|---|---|---|---|
| 6,407,401 | B1 | 6/2002 | Kondoh et al. |
| 2002/0190262 | A1* | 12/2002 | Nitta et al. .................... 257/99 |
| 2004/0004435 | A1* | 1/2004 | Hsu ............................ 313/512 |
| 2004/0119668 | A1* | 6/2004 | Homma et al. ................ 345/82 |
| 2006/0050526 | A1* | 3/2006 | Ikeda et al. .................. 362/555 |
| 2006/0119250 | A1* | 6/2006 | Suehiro et al. ............. 313/498 |

FOREIGN PATENT DOCUMENTS

| | | |
|---|---|---|
| JP | S62-73563 | 5/1987 |
| JP | 2000-058927 | 2/2000 |

OTHER PUBLICATIONS

English Abstract of JP Application 10-223008, Publication No. 2000-058927, Feb. 25, 2000, Patent Abstracts of Japan, Japanese Patent Office Website.
Chinese Patent Office, Chinese Office Action, Jul. 6, 2007, APP No. 200610054930.0.

* cited by examiner

*Primary Examiner*—Jerome Jackson
*Assistant Examiner*—Jami M Valentine
(74) *Attorney, Agent, or Firm*—Neil Henderson; Ralph A. Dowell

(57) ABSTRACT

A light emitting diode includes a light emitting body, a lead frame supplying power to the light emitting body and a light transmitting resin covering the light emitting body and part of the lead frame. The top surface of the light transmitting resin is formed as a plane at a position that satisfies a condition in which part of radiated light from the light emitting body is totally reflected. An inclined surface is formed at a position that satisfies a condition in which part of the radiated light is refracted in a downward direction away from a line perpendicular to the inclined surface.

1 Claim, 12 Drawing Sheets

LIGHT-EMITTING DIODE FOR DECORATION

BACKGROUND OF THE INVENTION

1. Field of the Invention

The present invention relates to a light-emitting diode and, more particularly, to a light-emitting diode used for decoration.

2. Description of the Related Art

FIG. 1 is a schematic view of a light-emitting diode according to the related art. Arrows in FIG. 1 designate the direction of emitted light. Conventionally, a light-emitting diode is primarily used as an indicator in an electronic appliance, etc. Therefore, a light-emitting diode according to the related art exhibits very sharp front directionality since there is a requirement to ensure visibility from the front (from top of FIG. 1).

Recently, light-emitting diodes have become more and more advanced and are often used in electric bulletin boards, traffic signals and the like. In such applications, it is necessary to ensure that light is visible from oblique directions as well as from the front. Directionality is reduced by taking measures such as providing multiple diodes facing in respective directions and providing a light diffusing plate or a light diffusing film in the front of a light-emitting diode. Patent document No. 1 proposes a method of reducing directionality by providing a plane on top of a convex lens constituting a light-emitting diode.

It will be noted that proposals have been made recently to use light-emitting diodes for decorative purposes such as tree illumination. A light-emitting diode consumes less power and assures longer life than a light bulb, which is conventionally used for decorative purposes, but is not inherently suitable for decorative purposes due to its sharp directionality. For this reason, a method has been proposed to produce less directional light by forming the surface of the light-transmitting resin of a light-emitting diode to resemble frosted glass (patent document No. 2).

[patent-related document No. 1]

Gazette containing the Utility Model No. 62-73563

[patent-related document No. 2]

JP 2000-58927 A

In decorative applications such as tree illumination, it is often unknown which direction a light-emitting diode faces when installed. It is thus desirable that light can be visible from any directions. In applications like panel illumination (especially when a panel is formed of a metal such as aluminum), the decorative effect of panel illumination is enhanced by allowing light to be reflected by the panel to which the light-emitting diodes are attached as well as by using light directly emitted by light-emitting diodes. Therefore, it is desirable that light radiated from the light-emitting diodes be not only back-to-front directional but also front-to-back, right-to-left and left-to-right directional.

Another point of note is that a large number of light-emitting diodes are used for decorative purposes. In this respect, it is desirable that the fabrication cost be reduced. According to patent document No. 2, an extra lithographic step is required to form the top surface of the light-emitting diode to resemble frosted glass. In such an approach, the fabrication cost is increased.

SUMMARY OF THE INVENTION

Accordingly, a primary purpose of the present invention is to provide a light-emitting diode suitable for decorative purposes.

The light emitting diode according to an embodiment of the present invention comprises: a light emitting body; a lead frame supplying power to the light emitting body; a light transmitting resin covering the light emitting body and part of the lead frame, wherein the top surface of the light transmitting resin is formed as a plane at a position that satisfies a condition in which part of light radiated by the light emitting body is totally reflected, and an inclined surface is formed between the edge of the top surface of the light transmitting resin and the side of the light transmitting resin.

According to this embodiment, part of the light radiated by the light-emitting body is totally reflected by the top surface of the light-transmitting resin formed as a plane. Therefore, it is possible to produce light emitted downward from the light-emitting diode so that decorative effect is enhanced. Further, since the light-transmitting resin is provided with an inclined surface, the range in which multiple virtual images of the light-emitting body can be viewed is more extensive than when the inclined surface is not provided. Thus, it is possible to provide a light-emitting diode in which visibility is improved and which is suitable decorative purposes.

The inclined surface of the light-transmitting resin may be formed at a position that ensures that part of the light radiated by the light-emitting body is refracted in a downward direction away from a line perpendicular to the inclined surface. In this case, it is ensured that radiated light is refracted in a downward direction away from the line perpendicular to the inclined surface. The amount of light emitted laterally from the light-emitting diode is increased as compared to a light emitting diode in which the inclined surface is not provided. Thus, it is possible to provide a light-emitting diode suitable for decorative purposes.

The light-emitting body may be located in an area surrounded by the side of the light-transmitting resin. With this, the inclined surface is positioned above the light-emitting body so that the amount of light emitted laterally is increased.

The top surface of the light-emitting diode may be flush with the boundary between the inclined surface of the light-transmitting resin and the side. In this way, it is ensured that some light is emitted laterally and the amount of light reflected downward is increased so that the decorative effect of the light-emitting diode is enhanced.

The inclined surface of the light-transmitting resin may be formed as a convex lens. In this case, the direction in which radiated light incident on the convex lens surface is refracted is adjustable. The light-transmitting resin may be epoxy resin. The refractive index of the light-transmitting resin may be between 1.3 and 1.5, both inclusive.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
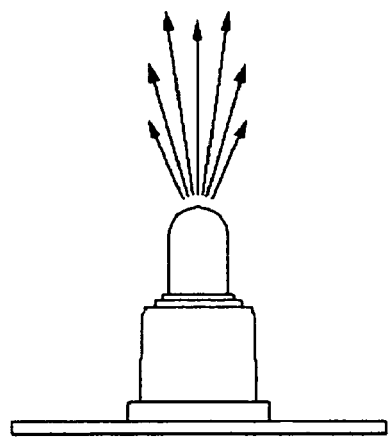
FIG. 1 is a schematic view of a light-emitting diode according to the related art.
Figure 2:
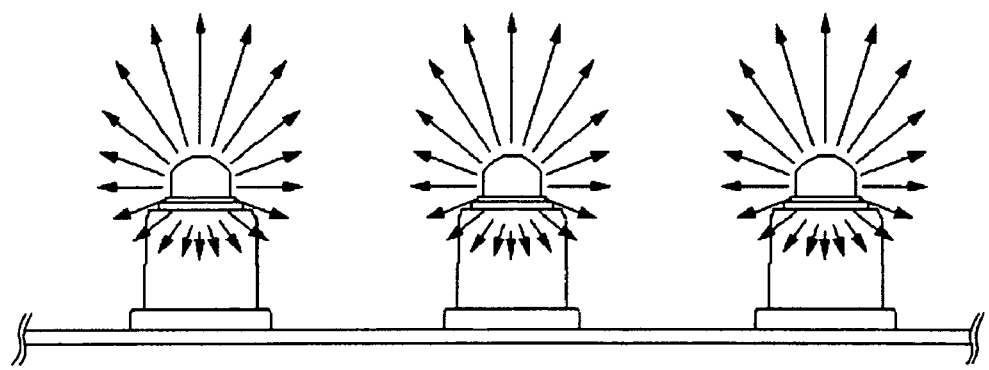
FIG. 2 shows lighting equipment for decoration in which multiple light-emitting diodes according to an embodiment of the present invention are connected.

FIG. 2 shows lighting equipment for decoration in which multiple light-emitting diodes according to the embodiment are connected. In FIG. 2, arrows indicate directions of emitted light. The light-emitting diode according to the embodiment is not only capable of emitting light in an upward direction but also in a downward direction and in a lateral direction. As such, the light-emitting diode according to the embodiment is suitable for decorative purposes. The upward direction of emission from the light-emitting diode is a direction away from a light source and toward the top surface or the neighborhood thereof of the resin covering the light source. Similarly, the downward direction of emission from the light-emitting diode is a direction away from the light source and toward the bottom surface of the resin. A detailed description of the light-emitting diode according to the embodiment will be given with reference to the drawings.

Figure 3:
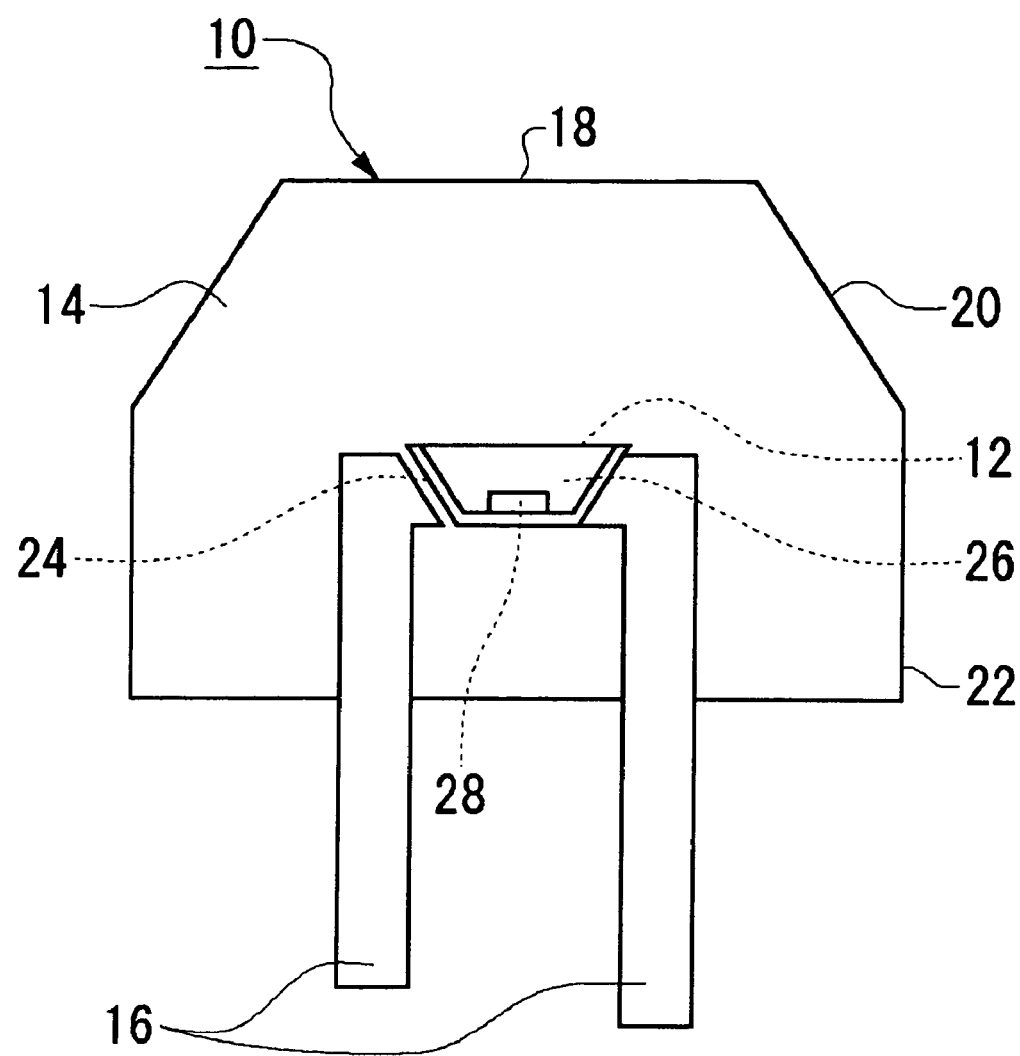
FIG. 3 is a schematic longitudinal sectional view of the light-emitting diode according to the embodiment.

FIG. 3 is a schematic longitudinal sectional view of the light-emitting diode according to the embodiment. A light-emitting body 12 comprises a mortar-like reflector 24 at the side and bottom thereof. An LED chip 28 is provided inside the reflector 24. A fluorescent body 26 fills a space around the LED chip 28. Preferably, the LED chip 28 is provided at the center of the reflector 24 and emits light with a relatively high intensity along a central axis. The fluorescent body 26 fills the space bounded by the edges of the opening of the reflector 24. The fluorescent body 26 is exposed on the top surface of the light-emitting body 12.

The LED chip 28 is supplied with electric power via lead frames 16. One of the lead frames 16 is connected to the reflector 24 and electrically connected to the LED chip 28. The other lead frame 16 is electrically connected to the LED chip 28 via a wire (not shown). The light-emitting body 12 and part of the lead frame 16 are covered by the light-transmitting resin 14. The light-transmitting resin 14 may be epoxy resin. The refractive index of the light-transmitting resin 14 may be larger than the refractive index of air. For example, the refractive index may be between 1.3 and 1.5, both inclusive.

A top surface 18 of the light-transmitting resin 14 of the light emitting diode 10 according to the embodiment is formed as a plane at a position that ensures that part of the light radiated by the light-emitting body 12 is totally reflected. An inclined surface 20 is formed to descend from the edge of the top surface 18 to the side 22 of the light-emitting resin 14. Radiated light is defined here as light not reflected or refracted at all after being radiated from the light-emitting body 12.

By ensuring that part of the radiated light is totally reflected by the top surface 18, light emitted downward from the light-emitting diode 10 is generated so that decorative effect is enhanced.

As described, the fluorescent body 26 is exposed on the top surface of the light-emitting body 12 to occupy a certain area. While the light-emitting body 12 is a plane emission light source, it may essentially be regarded as a point light source since the LED chip 28 is provided at the center of the reflector 24. In the following description, it will be assumed that the light-emitting body 12 is a point light source.

Light is emitted by a light source at various angles of radiation $\theta$. The angle of radiation $\theta$ is defined an angle of light with respect to a perpendicular line from the light source to a top surface 18. The maximum angle of radiation $\theta m$ is determined by the LED chip 28, the reflector 24, the fluorescent body 26 and the light-transmitting resin 14 and the like. In the case of the light-emitting diode 10 according to this embodiment, it will be assumed that the maximum angle of radiation $\theta m$ is larger than a critical angle $\theta c$ in order to ensure that some radiated light is totally reflected by the top surface 18 of the light-transmitting resin 14. The side of the light-emitting body 12 is covered by the reflector 24 so that downward radiation is prohibited. Therefore, the maximum value of $\theta m$ is 90°.

Light travels in roughly straight lines in a uniform substance. At an interface between different substances, reflection and refraction occur. When light from a substance with a higher refractive index (n1) is incident on a substance with a lower refractive index (n2), light incident at an angle of incidence larger than the critical angle $\theta c$ determined by the refractive indices n1 and n2 is totally reflected instead of being refracted. The law of reflection requires that the angle of reflection be identical with the angle of incidence.

Figure 4:
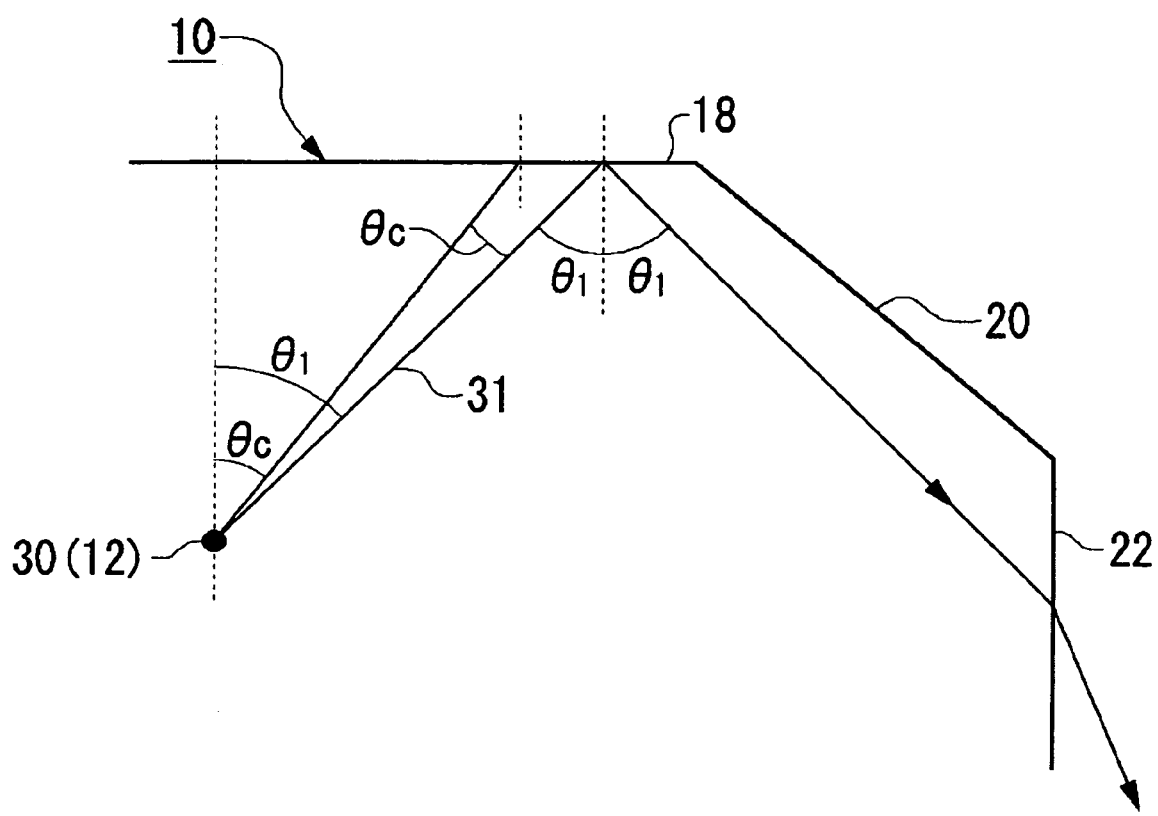
FIG. 4 illustrates how total reflection occurs.

FIG. 4 illustrates how total reflection occurs. Hereinafter, the light-emitting body 12 is described as a light source 30. Radiated light 31 radiated by the light source 30 at an angle of radiation $\theta 1$ larger than the critical angle $\theta c$ and incident on the top surface 18 at an angle of incidence $\theta 1$ is totally reflected at an angle of reflection $\theta 1$. Part of the reflected light is refracted by the side 22 or the inclined surface 20 before being emitted to a surrounding space.

Figure 5:
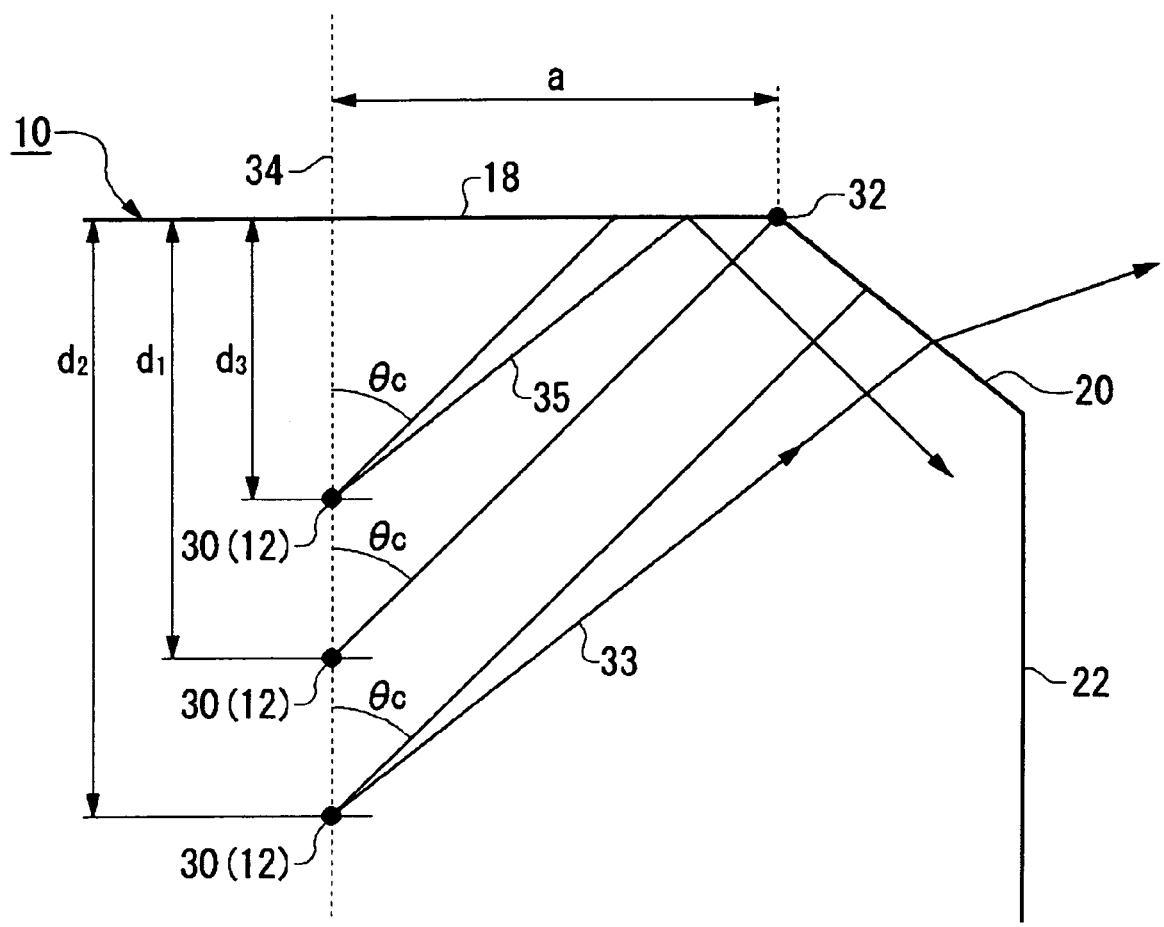
FIG. 5 illustrates a condition in which part of radiated light is totally reflected by the top surface.

FIG. 5 illustrates a condition in which part of the radiated light is totally reflected by the top surface. It will be assumed that the distance between the light source 30 and the top surface 18 is denoted by d, and the distance d occurring when a straight line extending from the light source 30 in the direction making the critical angle $\theta c$ intersects with a boundary 32 between the top surface 18 and the inclined surface 20 is denoted by d1. If d is larger than d1 (d2 in FIG. 5), radiated light 33 radiated at the angle of radiation $\theta$ which is larger than the critical angle $\theta c$ is incident on the inclined surface 20 or the side 22 and is not totally reflected by the top surface 18. When d is smaller than d1 (d3 in FIG. 5), the angle of radiation $\theta$ is larger than the critical angle $\theta c$ so that radiated light 35 incident on the top surface 18 is totally reflected by the top surface 18.

Referring to FIG. 5, denoting the distance between the perpendicular line 34 from the light source 30 to the top surface 18 and the boundary 32 by a, the condition in which part of the radiated light is totally reflected is given by $d < a/\tan\theta c$ (1).

By setting the distance d to a value that satisfies the expression (1), it is ensured that some radiated light is totally reflected by the top surface 18 and directed downward and below the light-emitting diode 10.

As already described, the inclined surface 20 is formed to descend from the edge of the top surface 18 to the side 22. By providing the inclined surface 20, light emitted laterally from the light emitting diode 10 is generated so that decorative effect is enhanced.

Figure 6:
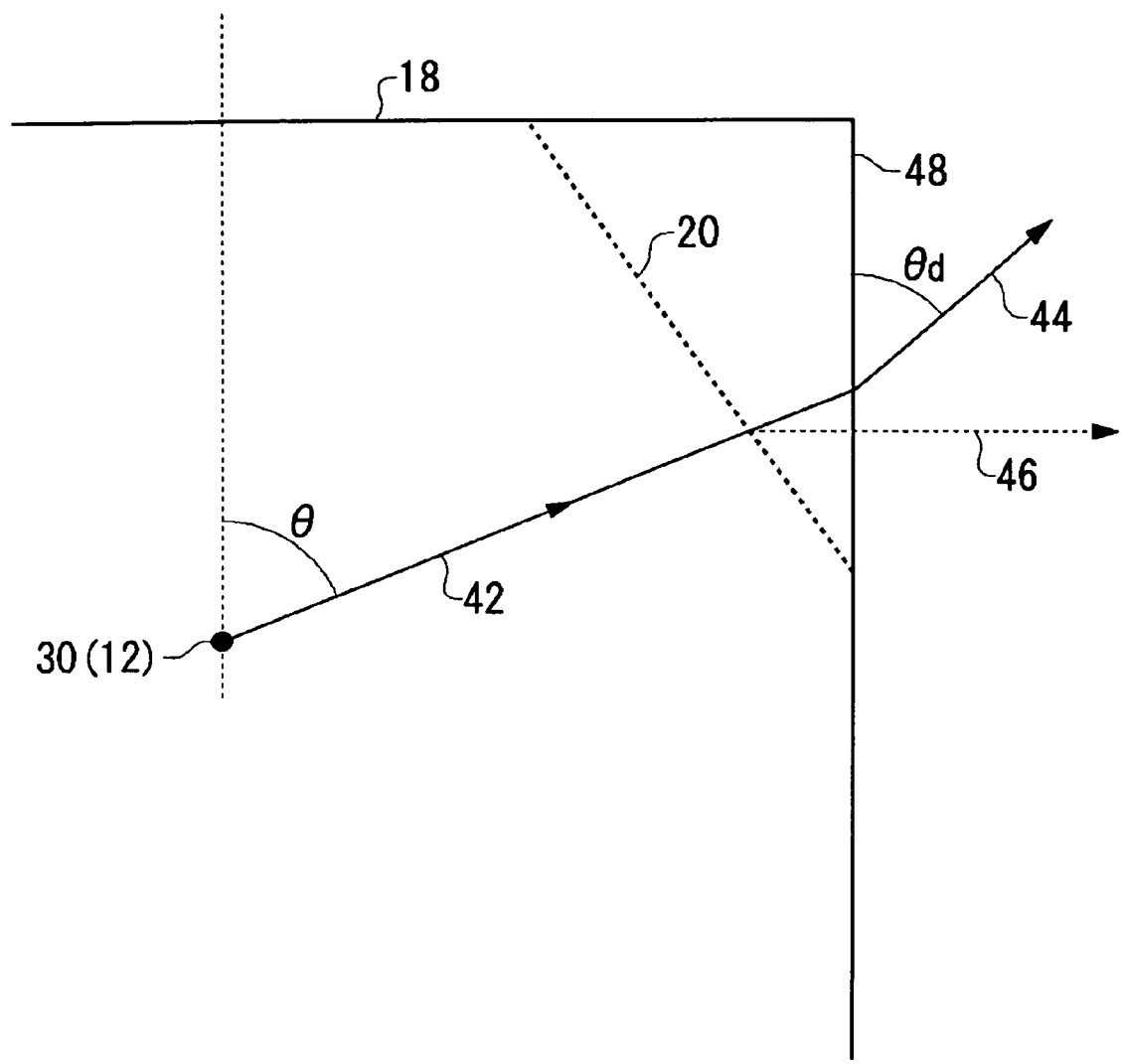
FIG. 6 illustrates how an optical path is changed as a result of providing an inclined surface.

FIG. 6 illustrates how an optical path is changed as a result of providing the inclined surface. A description will first be given of an optical path of emitted light occurring in a case where the inclined surface 20 is not provided. Radiated light 42 radiated from the light source at the angle of radiation θ and incident on the side 48 is refracted before being emitted from the side 48 to a surrounding space (emitted light 44). Snell's law requires that the angle of refraction of the radiated light 42 be larger than the angle of incidence. Therefore, denoting the angle of emission of the emitted light 44 by θd, the angle of emission θd is smaller than the angle of radiation θ of the radiated light. Since the angle of radiation θ is smaller than 90° without exception, the emitted light 44 is directed in an upward direction away from the light-emitting diode.

In contrast, when the inclined surface 20 indicated by a dotted line in FIG. 6 is provided, the radiated light 42 radiated from the light source at the angle of radiation θ and incident on the inclined surface 20 is refracted by the inclined surface 20 before being emitted to a surrounding space, as emitted light 46 indicated by a thin dotted line. Thus, by providing the inclined surface 20, it is ensured that radiated light is refracted in a downward direction away from the line perpendicular to the inclined surface 20 so that the amount of light emitted laterally is increased as compared to a light emitting diode in which the inclined surface is not provided. That radiated light is refracted in a downward direction away from the perpendicular line means that radiated light is refracted such that an angle formed by refracted light and the side is smaller than an obtuse angle formed by the perpendicular line and the side.

Figure 7:
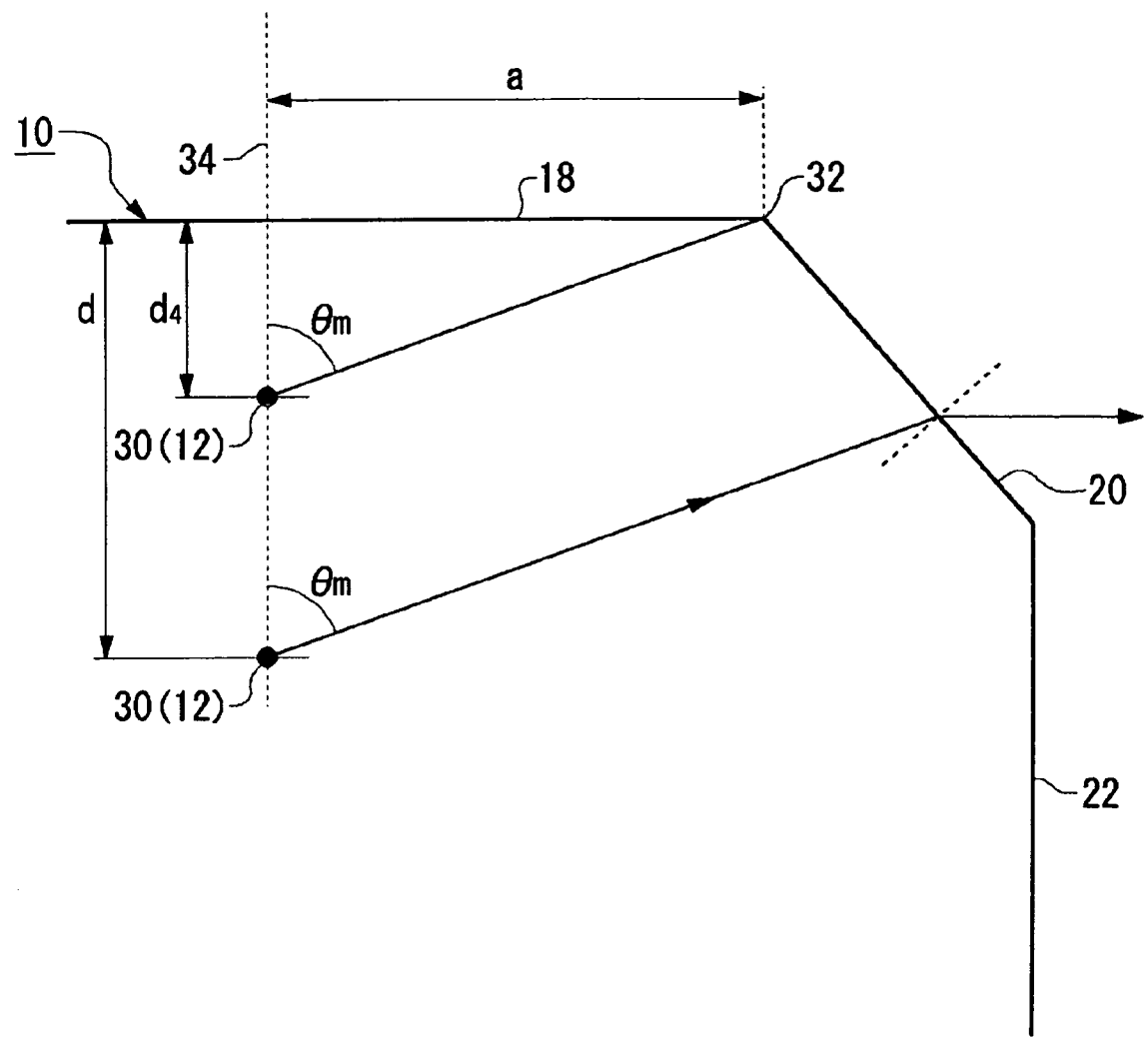
FIG. 7 illustrates a condition in which radiated light is incident on the inclined surface.

FIG. 7 illustrates a condition in which radiated light is incident on the inclined surface. Referring to FIG. 7, denoting the distance d occurring when the line extending from the light source 30 at the maximum angle of radiation θm intersects the boundary 32 by d4, the radiated light is incident on the inclined surface 20 when d is larger than d4.

FIG. 7 shows that the condition in which part of the radiated light is incident on the inclined surface 20 is given by:

$$d > a/\tan\theta m \quad (2)$$

Figure 8:
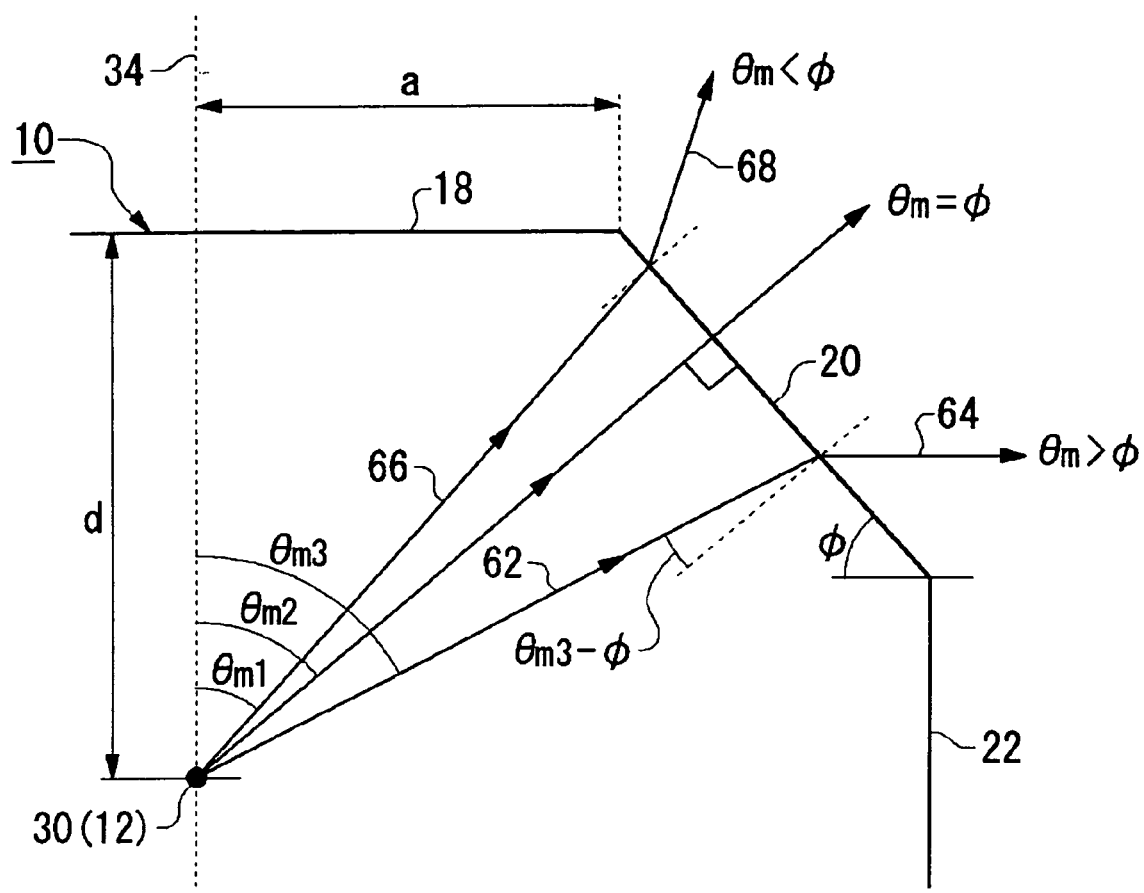
FIG. 8 illustrates a condition in which radiated light incident on the inclined surface is refracted in a downward direction away from a line perpendicular to the inclined surface.

FIG. 8 illustrates a condition in which radiated light incident on the inclined surface is refracted in a downward direction away from the line perpendicular to the inclined surface. Denoting the angle of inclination of the inclined surface by φ, the angle of incidence on the inclined surface 20 of the radiated light radiated at the angle of radiation θ is given by an absolute value of θ-φ.

As shown in FIG. 8, if the angle of inclination φ is larger than the maximum angle of radiation θm (θm1), radiated light 66 is refracted in an upward direction away from the line perpendicular to the inclined surface 20 before being emitted to a surrounding space (emitted light 68). In contrast, if the angle of inclination φ is smaller than the maximum angle of radiation θm (θm3), radiated light 62 is refracted in a downward direction away from the line perpendicular to the inclined surface 20 before being emitted to a surrounding space (radiated light 64).

Thus, by setting the distance d to a value that satisfies the expression (2) and setting the angle of inclination φ of the inclined surface 20 to be smaller than the maximum angle of radiation θm, it is ensured that radiated light incident on the inclined surface 20 is refracted in a downward direction away from the line perpendicular to the inclined surface 20. Accordingly, the amount of light emitted laterally from the light emitting diode 10 is increased as compared to a light emitting diode in which the inclined surface is not provided.

Figure 9:
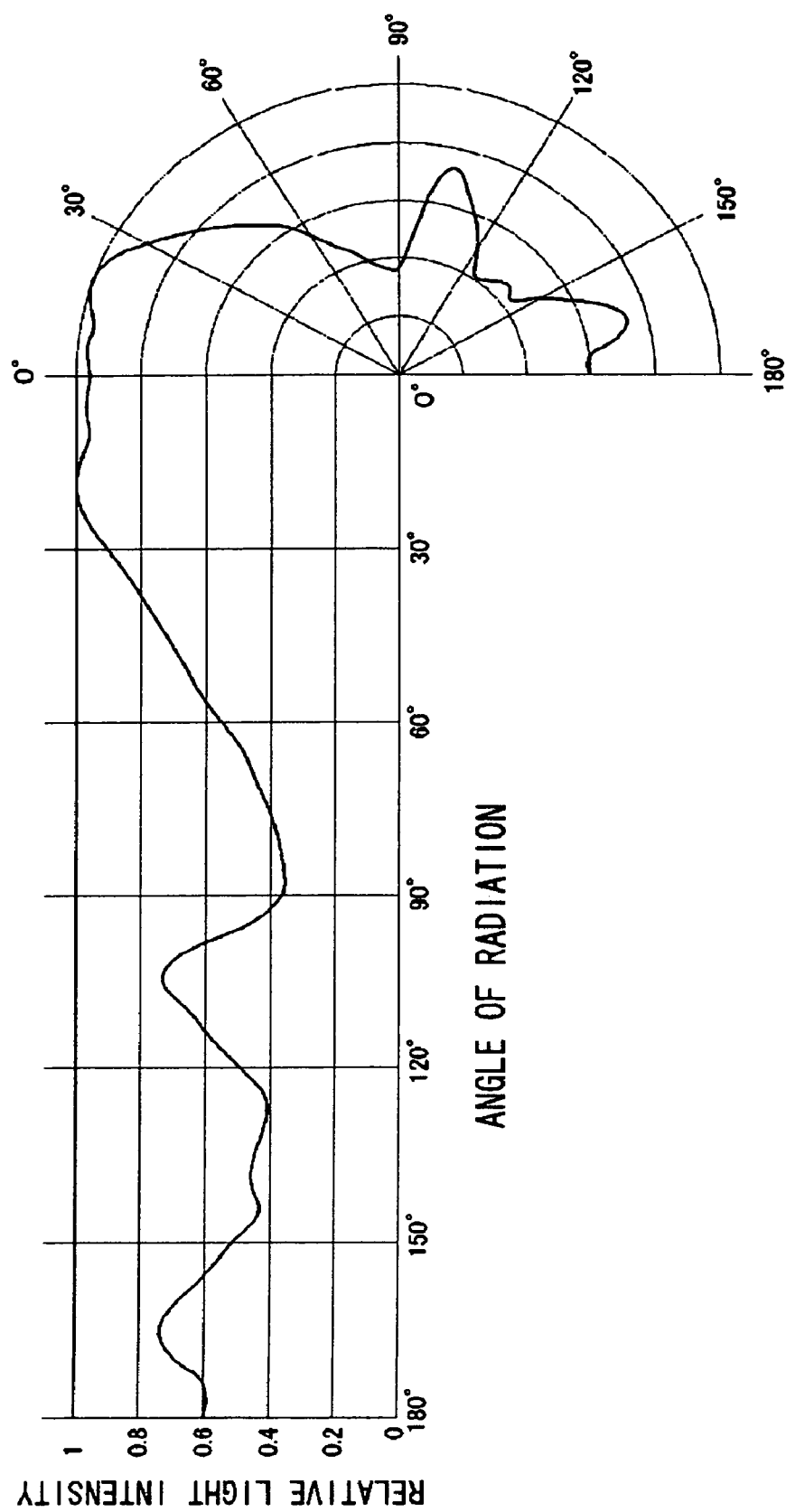
FIG. 9 illustrates the directionality of the light-emitting diode.

FIG. 9 illustrates the directionality of the light-emitting diode. Measurement is performed with the light-emitting diode 10 in which the distance d is set to a value that satisfies the condition defined by expressions (1) and (2). The angle of inclination θ of the inclined surface 20 is set to be smaller than the maximum angle of radiation θm.

In the case of an ordinary light-emitting diode, light intensity is reduced to nearly 0% in the range of 90°-180°. In the light-emitting diode according to the embodiment, light intensity of nearly 40% or above is achieved in the range of 90°-180°. The light emitting diode exhibits light intensity of 70% or above near 105° and 165°. The characteristic demonstrates that the light-emitting diode 10 is excellent in decorative applications.

It is well known that, given the same amount of light, visibility of light is more favorable if the light emitting area of a light source is wider. Visibility according to this embodiment is improved by making it appear that the light emitting area of the light-emitting body 12 is wider than it actually is.

When light from an object is diffused by a lens, a reflecting mirror or the like, a virtual image is created at a position where backward extensions of diffused beams converge. In case multiple virtual images of the light emitting body 12 are viewed, the light emitting area appears to be more extensive than it actually is. Accordingly, visibility is improved and decorative effect is enhanced. Since the inclined surface 20 is provided in the light emitting diode 10 according to the embodiment, the range in which multiple virtual images of the light emitting body 12 are viewed is more extensive than when the inclined surface 20 is not provided.

Figure 10A:
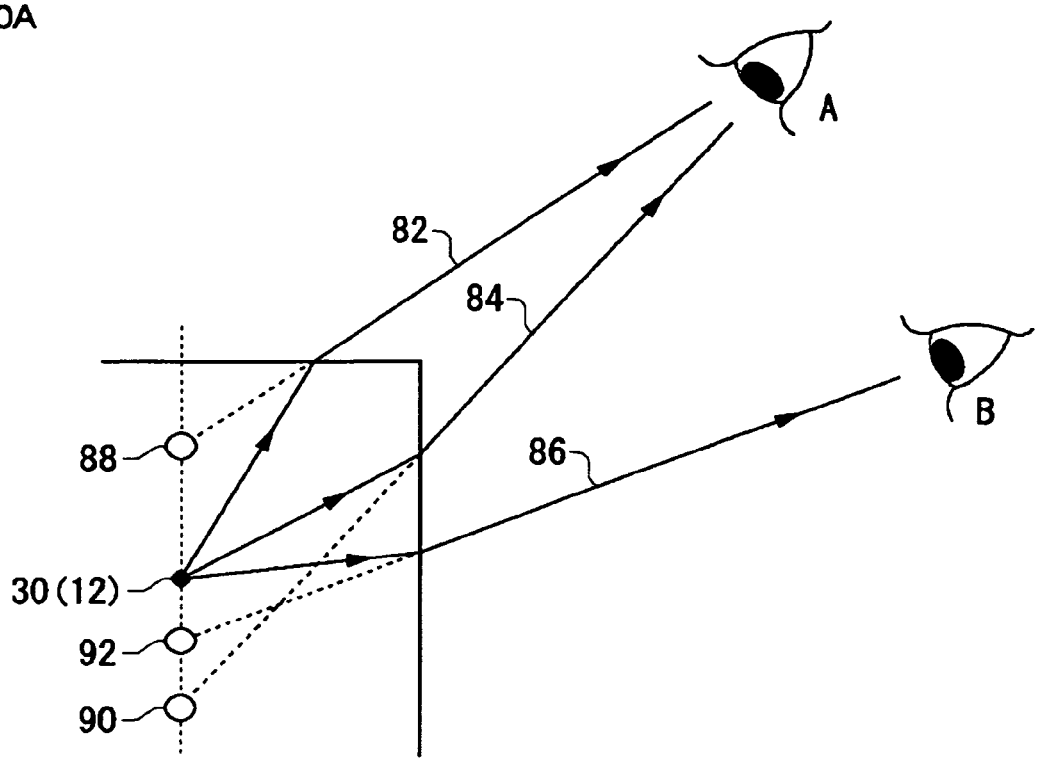
FIGS. 10A and 10B illustrate ranges in which virtual images can be viewed.
Figure 10B:
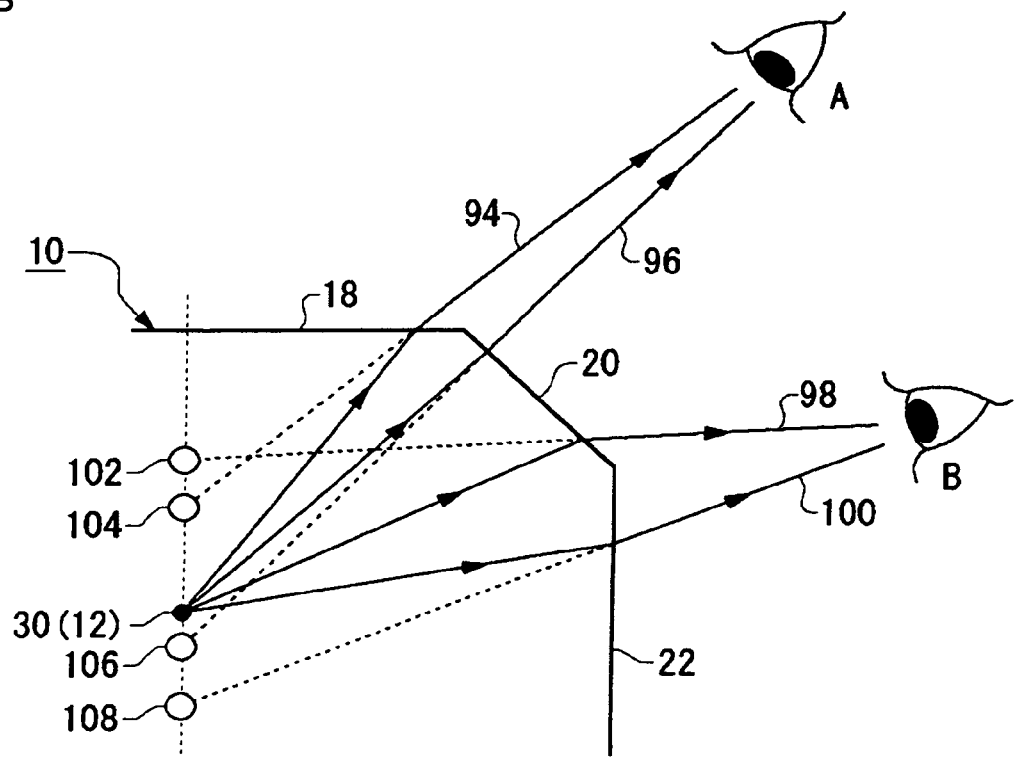

FIGS. 10A and 10B illustrate ranges in which virtual images can be viewed. It will continue to be assumed that the light-emitting body 12 is a point light source. FIG. 10A illustrates a range in which virtual images can be viewed in a case where the inclined surface 20 is not provided. When the light-emitting diode is viewed at position A, two optical paths occur between the light source 30 and position A. In this case, a virtual image 88 is viewed on a straight line extending from a beam of emitted light 82, and a virtual image 90 is viewed on a straight line extending from emitted light 84. Therefore, a total of two virtual images of the light source 30 are viewed. In contrast, when the light-emitting diode is viewed at position B, only one optical path of emitted light 86 occurs between the light source 30 and position B so that only one virtual image 92 is viewed.

FIG. 10B illustrates a range in which virtual images can be viewed in a case where the inclined surface 20 is provided. When the light-emitting diode 10 is viewed at position A, two optical paths traveled by radiated light 94 and radiated light 96 occur between the light source 30 and position A. In this case, a virtual image 104 and a virtual image 106 are viewed. Similarly, when the light-emitting diode 10 is viewed at position B, two optical paths traveled by radiated light 98 and radiated light 100 occur between the light source 30 and position B. Therefore, a virtual image 102 and a virtual image 108 are viewed.

Thus, the light-emitting diode 10 according to the embodiment ensures more extensive range in which multiple virtual images can be viewed than the related-art diode, by providing the inclined surface.

Figure 11:
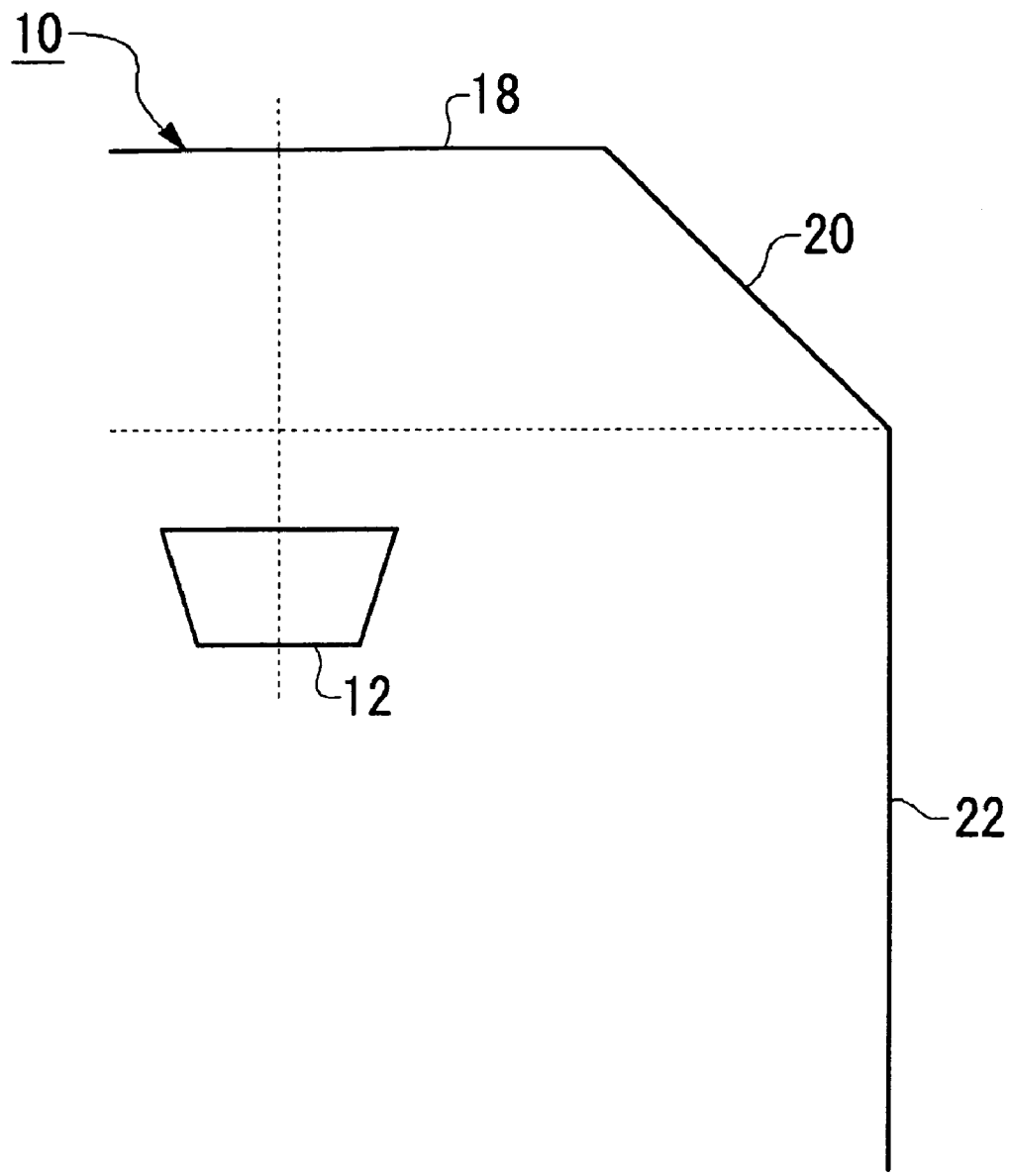
FIG. 11 shows a light-emitting diode in which the light-emitting body is located in an area surrounded by the side of a light-transmitting resin.

The light-emitting body 12 may be located in an area surrounded by the side 22 of the light-transmitting resin 14. FIG. 11 shows a light-emitting diode in which the light-emitting body 12 is located in an area surrounded by the side of the light-transmitting resin. According to this arrangement, the inclined surface is positioned above the light-emitting body so that the amount of light emitted laterally is increased.

In this case, the condition in which part of the radiated light is totally reflected by the top surface 18 is satisfied and the condition in which radiated light is refracted in a downward direction away from the line perpendicular to the inclined surface 20 before being emitted is also satisfied. Accordingly, decorative effect is enhanced. In this way, it is ensured that some light is emitted laterally and the amount of light reflected downward is increased, thereby enhancing the decorative effect of the light-emitting diode.

Figure 12:
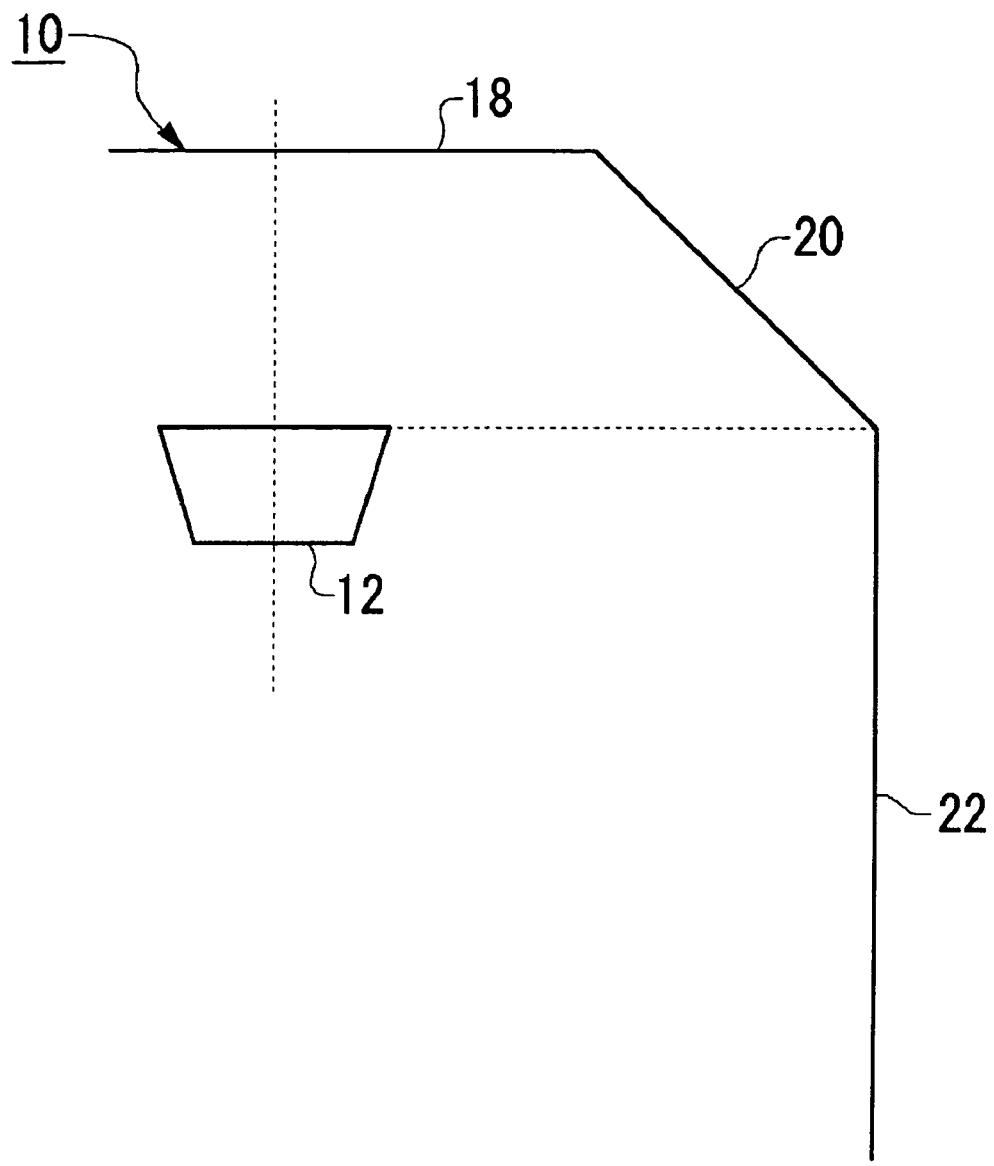
FIG. 12 shows a light emitting diode in which the top surface of a light emitting body is flush with the boundary between the inclined surface and the side of the light transmitting resin.

The top surface of the light-emitting diode 12 may be flush; with the boundary between the inclined surface 20 of the light-transmitting resin 14 and the side 22. FIG. 12 shows a light emitting diode in which the top surface of the light emitting body is flush with the boundary between the inclined surface and the side of the light transmitting resin.

In this case, the condition in which part of the radiated light is totally reflected by the top surface 18 is satisfied and the condition in which radiated light is refracted in a downward direction away from the line perpendicular to the inclined surface 20 before being emitted is also satisfied. Accordingly, decorative effect is enhanced.

Figure 13:
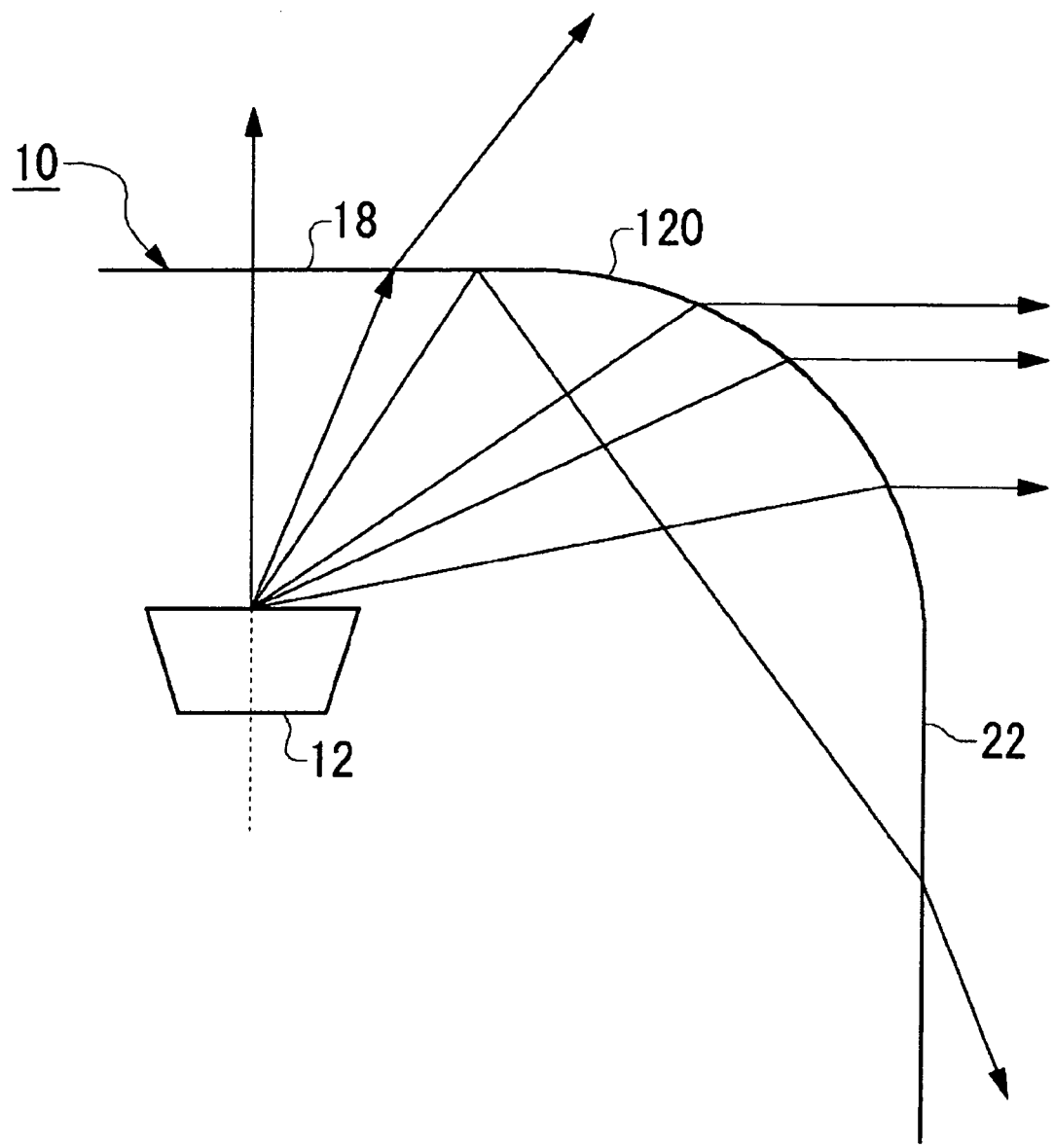
FIG. 13 shows a light-emitting diode in which the inclined surface is formed as a convex lens.

The inclined surface 20 of the light-transmitting resin 14 may be formed as a convex lens. FIG. 13 shows a light-emitting diode in which the inclined surface is formed as a convex lens. The angle of inclination φ of a convex lens surface 120 is equal to the angle of inclination of a tangential line of the convex lens surface.

In this case, by adjusting the radius of curvature of the convex lens surface 120, the direction of refraction of light incident on the convex lens 120 is adjusted so as to enhance decorative effect.

Given above is a description of the present invention based on the embodiment. The embodiment is only illustrative in nature and it will be obvious to those skilled in the art that variations in constituting elements and processes are possible within the scope of the present invention.

What is claimed is:
1. A light emitting diode comprising:
   a light emitting body;
   a lead frame supplying power to the light emitting body;
   a light transmitting resin covering the light emitting body and part of the lead frame, wherein:
      a top surface of the light transmitting resin is formed as a plane at a position that satisfies a condition in which part of light directly radiated from the light emitting body toward the top surface is totally reflected, and
      an inclined surface is formed between an edge of the top surface of the light transmitting resin and a side of the light transmitting resin; and
   wherein the light emitting diode is configured such that light totally reflected from the top surface passes through the side of the light transmitting resin.

* * * * *